United States Patent

[11] 3,607,252

[72] Inventor Robert E. North
St. Paul, Minn.

[21] Appl. No. 829,791
[22] Filed June 2, 1969
[45] Patented Sept. 21, 1971
[73] Assignee Sperry Rand Corporation
New York, N.Y.

[54] SOLDER ALLOY COMPOSITION
1 Claim, No Drawings

[52] U.S. Cl. .......... 75/175 A
[51] Int. Cl. .......... C22c 13/00
[50] Field of Search .......... 75/175 A

[56] References Cited

UNITED STATES PATENTS 2,180,139 11/1939 Deitz .......... 75/93
2,303,193 11/1942 Bouton et al. .......... 75/166

FOREIGN PATENTS 755,827 11/1933 France .......... 75/175 A

*Primary Examiner*—L. Dewayne Rutledge
*Assistant Examiner*—E. L. Weise
*Attorneys*—Kenneth T. Grace, Thomas J. Nikolai and John P. Dority

ABSTRACT: A composition of matter used in the assembly of products requiring both electrical and mechanical connections. The composition is of a solder alloy of tin, antimony, copper and lead having improved creep strength for mechanical connections with a sufficiently low melt temperature to permit the dip-soldering of electrical connections on electronic assemblies.

SOLDER ALLOY COMPOSITION

BACKGROUND OF THE INVENTION

In the assembling of electronic assemblies comprising various electronic components such as resistors, capacitors, diodes, and the like, upon printed circuit boards it is the general practice to extend the leads of such components through openings in the printed circuit boards achieving electrical connections to associated printed circuit conductors on and mechanical connection to the printed circuit board by means of automated dip-soldering techniques B see the publication "Automated soldering–Present and Future", Electronic Design News, Sept. 20, 1967, pgs. 36–43. In such techniques, 141 the printed circuit board, with the component leads extending through openings in the printed circuit board, has its bottom surface dipped into a molten bath of a suitable solder alloy having the necessary electrical and mechanical characteristics. In the past, the solder alloy making up the molten bath has been commercially available 60 percent tin-40 percent lead composition. However, although such solder composition does provide satisfactory electrical coupling, its creep strength, i.e., the constant nominal stress that will cause a specified creep rate at a constant temperature, for mechanical connections is unsatisfactory for electronic assemblies that must be subjected to high levels of vibration and shock. Other commercially available solder alloys having the desirable physical characteristics to provide satisfactory mechanical connections have melt temperatures that are too high as the electronic components being soldered cannot be subjected to the high temperature that is sufficient to melt the solder alloy and maintain the molten solder bath at the desired temperatures.

SUMMARY OF THE INVENTION

The present invention is directed toward a solder alloy comprised of tin, antimony, copper and lead having improved creep strength for mechanical connections with a sufficiently low melt temperature to permit the dip soldering of electrical couplings to electronic assemblies.

DESCRIPTION OF THE PREFERRED EMBODIMENT

The solder alloy of the present invention has the following preferred formula, in which parts are expressed as percentages by weight:

(3)

| | | |
|---|---|---|
| Tin | % | 58.0% to (14) |
| Antimony | | 3.8% to 4.2% |
| | Copper | 0.5% to 1.5% |
| Lead | | 34.3% to 37.7% |

PREPARATION

The solder alloy of the present invention is prepared by initially melting the proper percentages of tin and lead together in a suitable crucible. After the tin and lead are melted and thoroughly mixed, the proper percentages of antimony and copper are added to the molten bath, one constituent element at a time, in the form of fine, pure metal granules and are mixed into the molten bath until completely dissolved. The molten bath is then cast into chill molds to maintain homogeneity while forming a solder slug. The solder slug is then, by any suitable means, extruded into a continuous wire strip and coiled upon a suitable mandrel for efficient packaging.

APPLICATION

The solder alloy of the present invention has particular applications to automated soldering techniques whereby various electronic components such as resistors, capacitors, diodes and the like, are assembled to printed circuit boards. In such arrangement the component leads of such components extend through openings in the printed circuit board whereby the protruding component lead and the bottom surface of the printed circuit board are dipped into a molten bath formed by the solder alloy of the present invention. The solder alloy of the present invention has a sufficiently low melt temperature to permit the dip soldering of electrical coupling on such electronic assemblies without adversely effecting the electronic components.

The solder alloy of the present invention has a melt temperature of approximately 13° to 19° F. higher than that of the commercially available 60% tin—40% lead composition (of approximately 365° F.). This This slightly higher melt temperature is unimportant as the optimum molten bath temperature for automated dip-soldering is in the order of 100° F. above its melting point, e.g., 480° F. to 500° F. Such molten bath temperature is well within the permissible range for the automated dip-soldering of electronic component leads on printed circuit boards.

After assembly of the electronic components to the printed circuit board the solder alloy of the present invention, having a higher creep strength (greater than 10 times that of commercially available 60% tin—40% lead composition) at severe, i.e., high stress levels, electronic component operating environments, provides improved overall structural strength for the so-formed mechanical connections. Further, because of the higher creep strength of the so-formed mechanical connections of the electronic components to the printed circuit board, the use of less perfect solder joints are permitted while maintaining the desirable reliability levels. Consequently, use of the solder alloy of the present invention reduces the amount of necessary touch-up work normally required on dip-soldered electronic assemblies.

What is claimed is:

1. In a composition of matter for assembling products requiring both electrical and mechanical connections, a solder alloy consisting essentially of the following ingredients in the approximately stated portions by weight:

| | |
|---|---|
| Tin | 58.0% to 60.0% |
| Antimony | 3.8% to 4.2% |
| Copper | 0.5% to 1.5% |
| Lead | 34.3% to 37.7% |

UNITED STATES PATENT OFFICE
CERTIFICATE OF CORRECTION

Patent No. 3,607,252 Dated September 21, 1971

Inventor(s) Robert E. North

It is certified that error appears in the above-identified patent and that said Letters Patent are hereby corrected as shown below:

Column 1, line 15, after "techniques," cancel -- 141 --; line 48, cancel "(3)"; line 50, after "Tin", cancel "%"; same line, after "58.0% to" cancel "(14)" and insert -- 60.0% --; line 52, "Copper" should be flush with lefthand margin. Column 2, line 28, after "This" cancel "This".

Signed and sealed this 17th day of October 1972.

(SEAL)
Attest:

EDWARD M.FLETCHER,JR.
Attesting Officer

ROBERT GOTTSCHALK
Commissioner of Patents

)RM PO-1050 (10-69)

USCOMM-DC 60376-P69
☆ U.S. GOVERNMENT PRINTING OFFICE : 1969 O—366-334.